United States Patent
Eby et al.

(10) Patent No.: US 7,606,092 B2
(45) Date of Patent: Oct. 20, 2009

(54) TESTING FOR SRAM MEMORY DATA RETENTION

(75) Inventors: Michael D. Eby, Battle Ground, WA (US); Gregory P. Mikol, Vancouver, WA (US); James E. DeMaris, Ridgefield, WA (US)

(73) Assignee: Analog Devices, Inc., Norwood, MA (US)

( * ) Notice: Subject to any disclaimer, the term of this patent is extended or adjusted under 35 U.S.C. 154(b) by 282 days.

(21) Appl. No.: 11/670,389

(22) Filed: Feb. 1, 2007

(65) Prior Publication Data

US 2008/0186784 A1    Aug. 7, 2008

(51) Int. Cl.
*G11C 7/00* (2006.01)

(52) U.S. Cl. .................. 365/201; 365/200; 365/202

(58) Field of Classification Search .......... 365/222, 365/200, 201, 202
See application file for complete search history.

(56) References Cited

U.S. PATENT DOCUMENTS 5,910,922 A * 6/1999 Huggins et al. ............. 365/201
5,930,185 A * 7/1999 Wendell ..................... 365/201
6,256,241 B1 * 7/2001 Mehalel ..................... 365/201
6,813,202 B2 * 11/2004 Iketani ....................... 365/201
2006/0187724 A1    8/2006 Pineda De Gyvez et al.

* cited by examiner

*Primary Examiner*—Tuan T Nguyen
*Assistant Examiner*—Hien N Nguyen
(74) *Attorney, Agent, or Firm*—Marger Johnson & McCollom, P.C.

(57) ABSTRACT

A method of testing a memory cell includes generating a logic low signal, generating a logic high signal, reducing the logic high signal to a level corresponding to the logic low signal plus an offset to produce a reduced logic high signal, providing the logic low signal and the reduced logic high signal to a memory cell, allowing the memory cell to achieve a memory state, and testing the memory cell to determine if the memory state is an expected memory state. A memory array has an array of memory blocks, a write select circuit to provide write data to the array of memory blocks, and a data retention test circuit to reduce write data having a level corresponding to a logic high to a level corresponding to a logic low plus an offset.

17 Claims, 7 Drawing Sheets

TESTING FOR SRAM MEMORY DATA RETENTION

BACKGROUND

Static Random Access Memory (SRAM) 6-transistor memory cells typically consist of 4 n-channel transistors and 2 p-channel transistors. FIG. 1 shows an example of such a cell 10. P-channel transistor P1 and n-channel transistor N1 form one inverter. and P2 and N3 for another inverter. The connections between the two inverters cause the output of each inverter to drive the input of the other, forming a cross-coupled latch 12. The remaining two n-channel transistors, N2 and N4, provide access to the input/output of the two inverters.

In the absence of the two access n-channel transistors N2 and N4, the cross-coupled latch 12 retains the state of any data written into the memory cell, with one inverter outputting a '0' and the other a '1.' If one or both of the p-channel transistors are weak or missing, the cell will fail to retain the data state for extended periods of time due to the inability of a weak or missing p-channel transistor to maintain the high state. Even with weak or missing p-channel transistors, the cell will retain the data dynamically for extended periods of time, ranging from many milliseconds to seconds.

Normal memory testing will identify the presence or absence of the n-channel transistors. Testing for the presence or absence of the p-channel transistors presents some problems. The test to identify the cells with missing or weak p-channel transistors typically writes a pattern, waits an extended period of time, and verifies the data state of the cell, then writes data that is the complement of the first pattern, again waits an extended period of time, and verifies the data state of the cell. Using complement data allows both data states to be tested. These tests may take many seconds to accomplish and may still result in suspect data, as the waiting period may not have been long enough to detect a cell failure as there is no way to reliably predict how long a faulty cell will retain data. No reliable, quick test for p-channel transistors in SRAM memory cells currently exists.

SUMMARY

One embodiment is a method of testing a memory cell including generating a logic low signal, generating a logic high signal, reducing the logic high signal to a level corresponding to the logic low signal plus an offset to produce a reduced logic high signal, providing the logic low signal and the reduced logic high signal to a memory cell, allowing the memory cell to achieve a memory state, and testing the memory cell to determine if the memory state is an expected memory state.

Another embodiment is memory array having an array of memory blocks, a write select circuit to provide write data to the array of memory blocks, and a data retention test circuit to reduce write data having a level corresponding to a logic high to a level corresponding to a logic low plus an offset.

Another embodiment is a method of testing a memory cell including providing write data, generating a first signal having a level corresponding to a logic low, generating a second signal to be a complement of the first signal such that the second signal is reduced to a reduced logic high level just above the level corresponding to a logic low, providing the first and second signals to a memory cell, and testing the memory cell to determine if the memory cell retains a state corresponding to the first and second signals.

BRIEF DESCRIPTION OF THE DRAWINGS

Embodiments of the invention may be best understood by reading the disclosure with reference to the drawings, wherein.

DETAILED DESCRIPTION OF THE EMBODIMENTS

Figure 1:
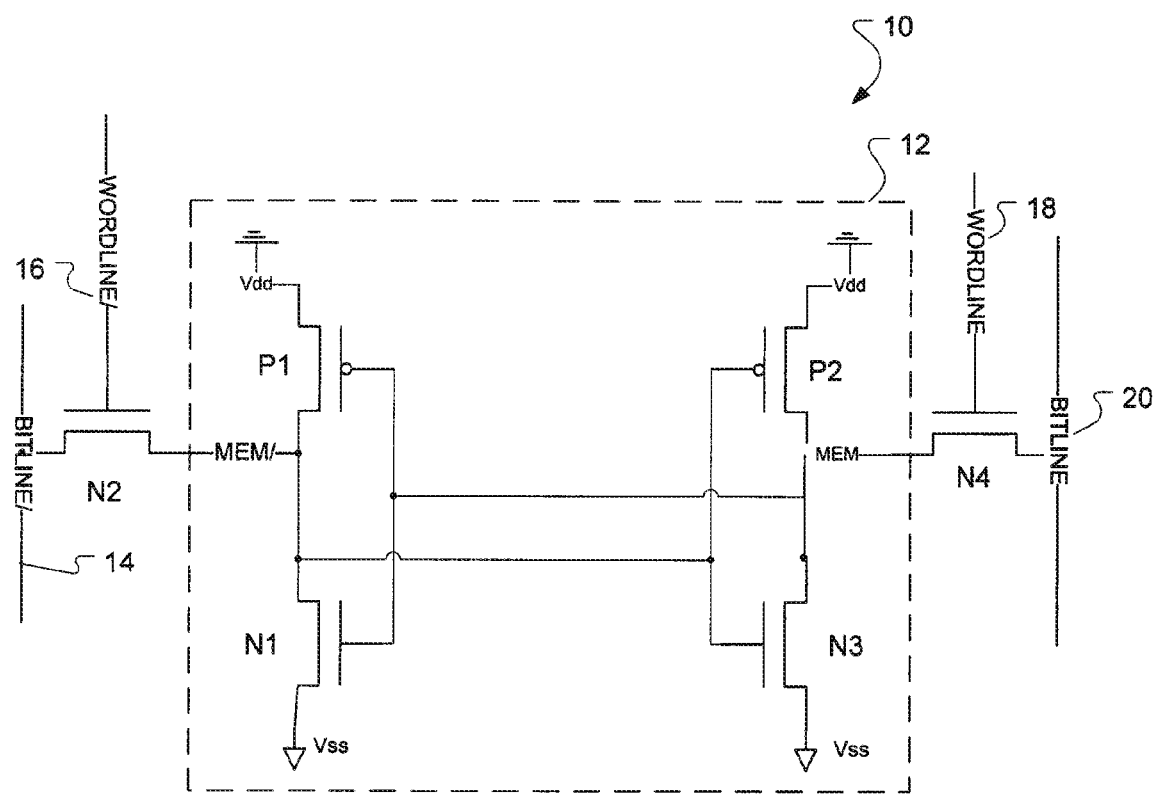
FIG. 1 shows an example of a 6-transistor cell.
Figure 2:
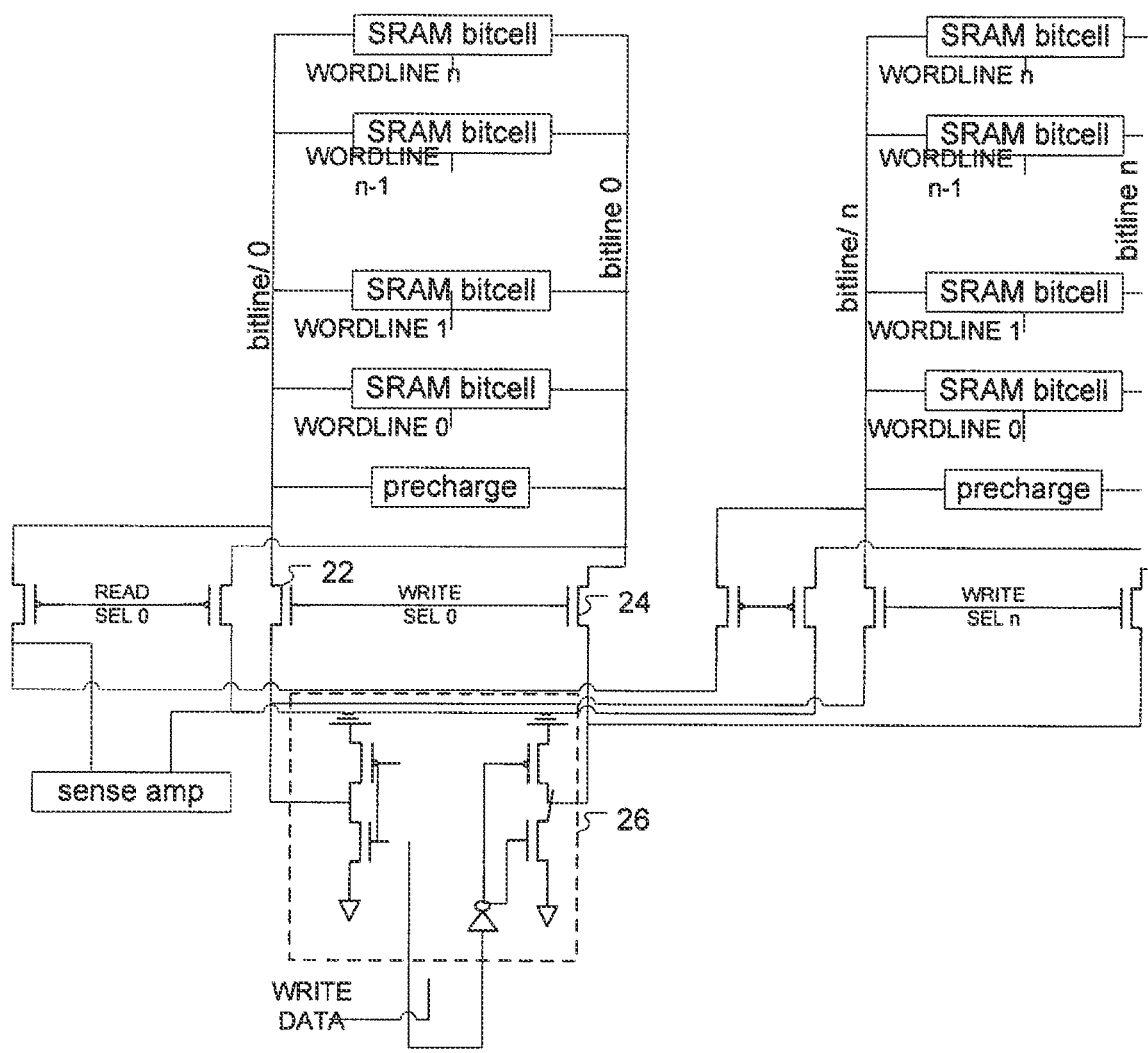
FIG. 2 shows an example of an SRAM array.

FIG. 2 shows a typical implementation of an SRAM memory array. Each SRAM bitcell block contains a typical 6-transistor SRAM cell as shown in FIG. 1. FIG. 2 shows only a small portion of such an array, each array may actually contain thousands of cells. No limitation to any particular size of array is intended, nor should any such limitation be inferred. It should also be noted that the 6-transistor cell may be used in other implementations than just an SRAM. By employing differently sized transistors, the cell could also be a data latch. For simplicity of discussion, both an SRAM cell and a data latch will be referred to as a memory cell.

A single wordline and column or columns are selected by the 'write select n'. Multiple columns may be selected depending upon the architecture and number of bits to be addressed simultaneously. The array receives 'write data' and the data and its complement route to the selected bitline and bitline/, respectively. The bitline and bitline/ have complemented data, with one line receiving a logic low or 0 signal and one line receiving a logic high or 1 signal. The line driving a logic 0 signal will achieve a full 0 level. The n-channel 'write select' transistor, such as 22 or 24 connected to the write selection circuit 26 for the left memory array, will reduce the high voltage of the logic 1 signal by a threshold voltage as the logic 1 signal passes through the n-channel transistor.

Referring to FIG. 1, if a p-channel transistor, such as P1 or P2, exists on the side driving to a logic 1 level, the p-channel transistor will provide the additional drive necessary to bring the reduced high level signal up to a full logic 1 level in the memory cell. If the p-channel transistor does not exist, or functions weakly, the high level signal will not be driven to the full level. The write to the cell finishes by shutting off the previously selected wordline, and the memory cell disconnects from bitline and bitline/.

For ease of discussion, the side driving a high logic 1 signal will be referred to here as the 'high side.' The side driving a low logic 0 signal will be referred to as the 'low side.' When the p-channel transistor exists, the high side signal will have a full logic 1 level and the low side signal will have a full logic 0 level. The cell will maintain this state.

If the p-channel transistor does not exist, or functions weakly, the low side will have a signal of a full logic 0 level and the high side will have a logic 1 signal of a reduced level. Generally, enough voltage will exist initially that the cell will function correctly during subsequent reads due to charge storage on the small cell capacitance. The reads that occur before significant stored charge leaks away will function correctly.

When enough charge leaks away and the high signal level drops to a point where the cell becomes unstable and 'flips,' the high side will drop to a logic 0 level and the low side will drive to a logic 1 level. The cell will remain in a state opposite to that which was purposely written. The leakage process takes an indeterminable amount of time to cause the cell to flip. The time depends on a number of variables, including cell capacitance, power supply voltage during writing, relative strength or weakness of the p-channel transistor, process parameters, temperature, etc. It is impossible to consistently and reliably determine this time for all possible cases.

Figure 3:
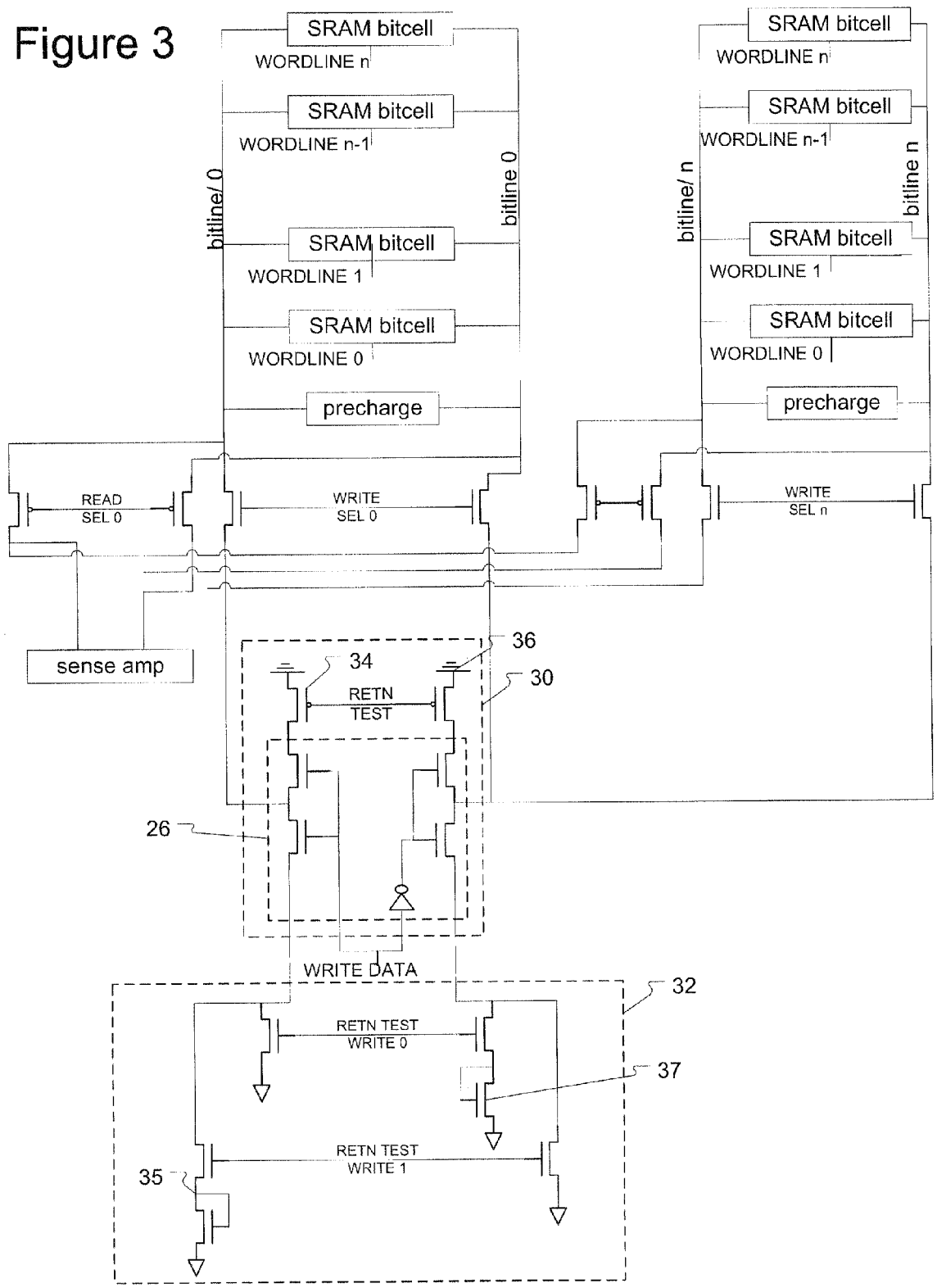
FIG. 3 shows an example of an SRAM array with data retention test circuitry.

However, using modified SRAM array circuitry it becomes possible to test the SRAM cell data retention more reliably and more quickly than previously. FIG. 3 shows an example of such a circuit. In FIG. 3, the write driver circuit 26 of FIG. 2 has been adapted as write driver circuit 30 to include write driver circuit 26 and two extra p-channel transistors 34 and 36.

During normal operation, transistors 34 and 36 remain active and provide a direct connection from the driver circuit 26 to the high power supply allowing complementary full level output high and low signals, During retention testing, a full high voltage level is not required, but rather one side is driven to a low level as is normally done, while the side that is normally driven to a full high level is rather driven to a level that is offset to be slightly elevated above the low level. Transistors 34 and 36 isolate write driver circuit 26 from the high power supply eliminating any potential current path between the low and high power supplies and allowing better control of the elevated offset voltage by external means due to elimination of any shunting path.

An additional circuit block 32, a data retention test circuit, allows for a special test mode. The data retention test circuit may include 'pull-down' transistors to reduce the voltage level of the high signal. This circuit will allow one side of the driver circuit 26 to achieve a low level and the other side to achieve a low level plus an offset of an n-channel threshold voltage. The threshold offset is determined by n-channel transistors 35 and 37. The offset voltage could similarly be achieved by using other circuit elements in place of the diode connected n-channel transistors 35 and 37.

Figure 4:
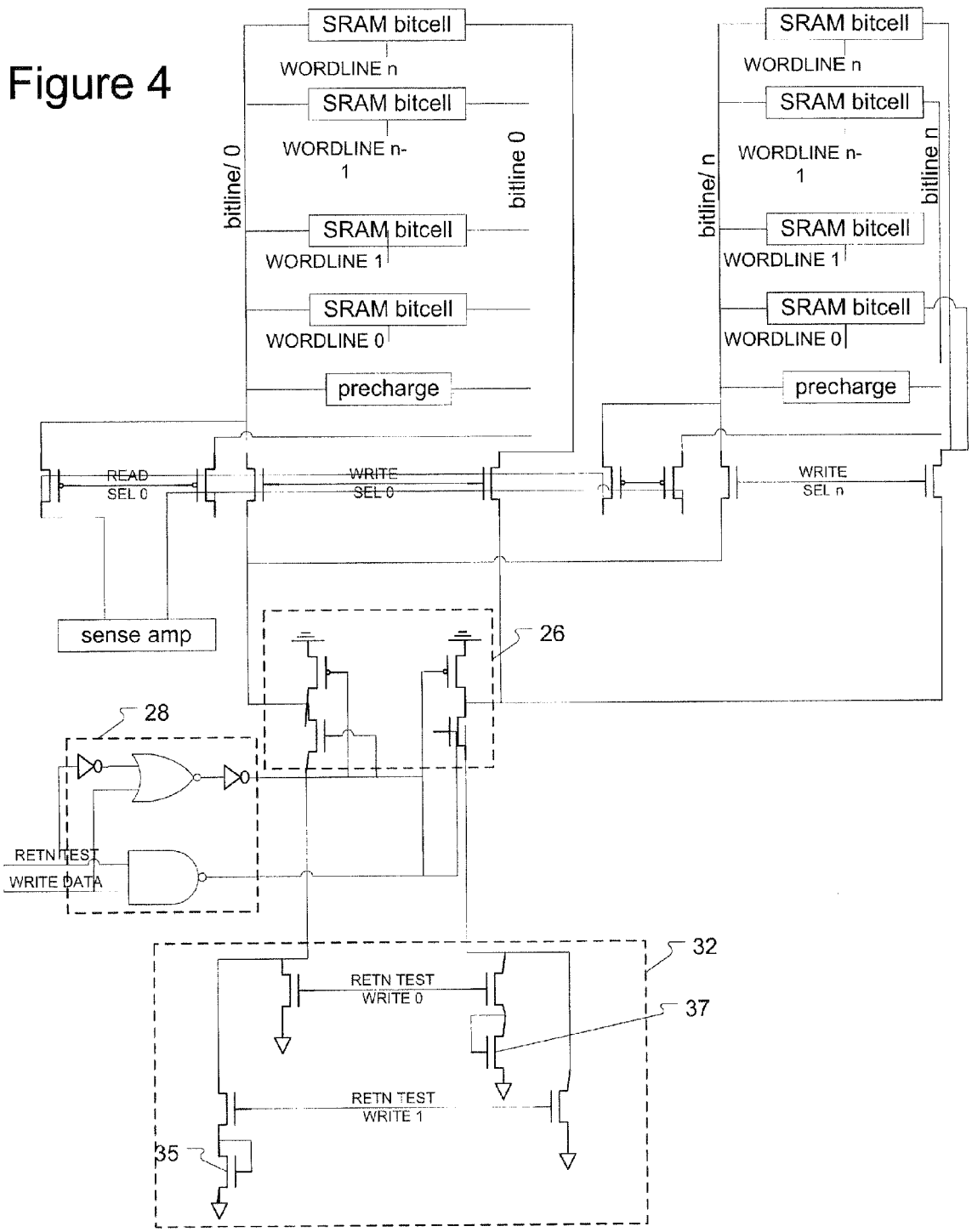
FIG. 4 shows an alternative example of an SRAM array with data retention test circuitry.
Figure 5:
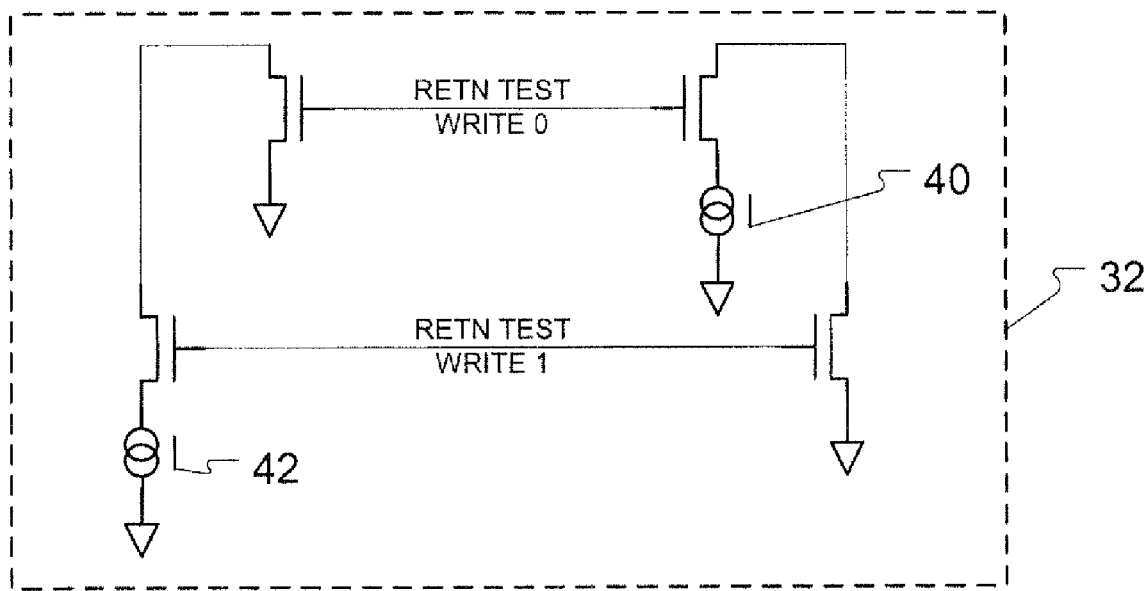
FIGS. 5 and 6 show examples of data retention test circuitry.
Figure 6:
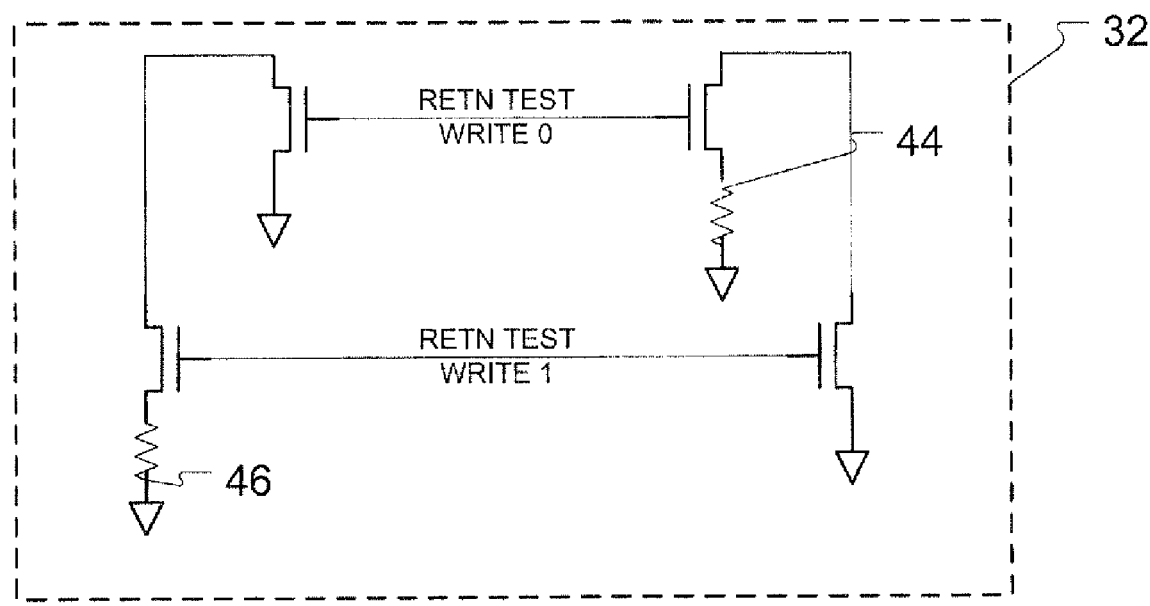

Another embodiment of the data retention test circuit is shown in FIG. 4. In this case, write driver circuit 26 is unaltered from that shown in FIG. 2, but the logic block 28 that controls block 26 is provided such that both p-channel transistors in the driver circuit are disabled or off during data retention test by retn-test low, and both n-channel transistors in the driver circuit are enabled or on. In the retention test mode, the levels presented by data retention test circuit block 32 pass through the n-channel transistors of write driver 26 to the selected bitline and bitline/. As previously stated, the data retention test circuit 32 can be implemented in a variety of ways as shown in FIGS. 5 and 6.

Other means to achieve the offset voltage include a diode connect p-channel transistor, a current source, or a resistance provided by a biased n-channel or p-channel transistor or a discrete resistor. FIGS. 5 and 6 shows alternative examples of the data retention test circuitsy. In FIG. 5, the n-channel transistors 35 and 37 that determine the threshold offset voltage, the offset voltage controllers, in FIG. 4 have been replaced with current sources 40 and 42 as the offset voltage controllers. The use of current sources may provide a 'programmability' aspect to the circuit, as manipulation of the current may allow the timing of the charge cycle to be controlled, as discussed with regard to FIG. 7. In FIG. 6, the resistors 44 and 46 are employed as the offset voltage controllers.

Figure 7:
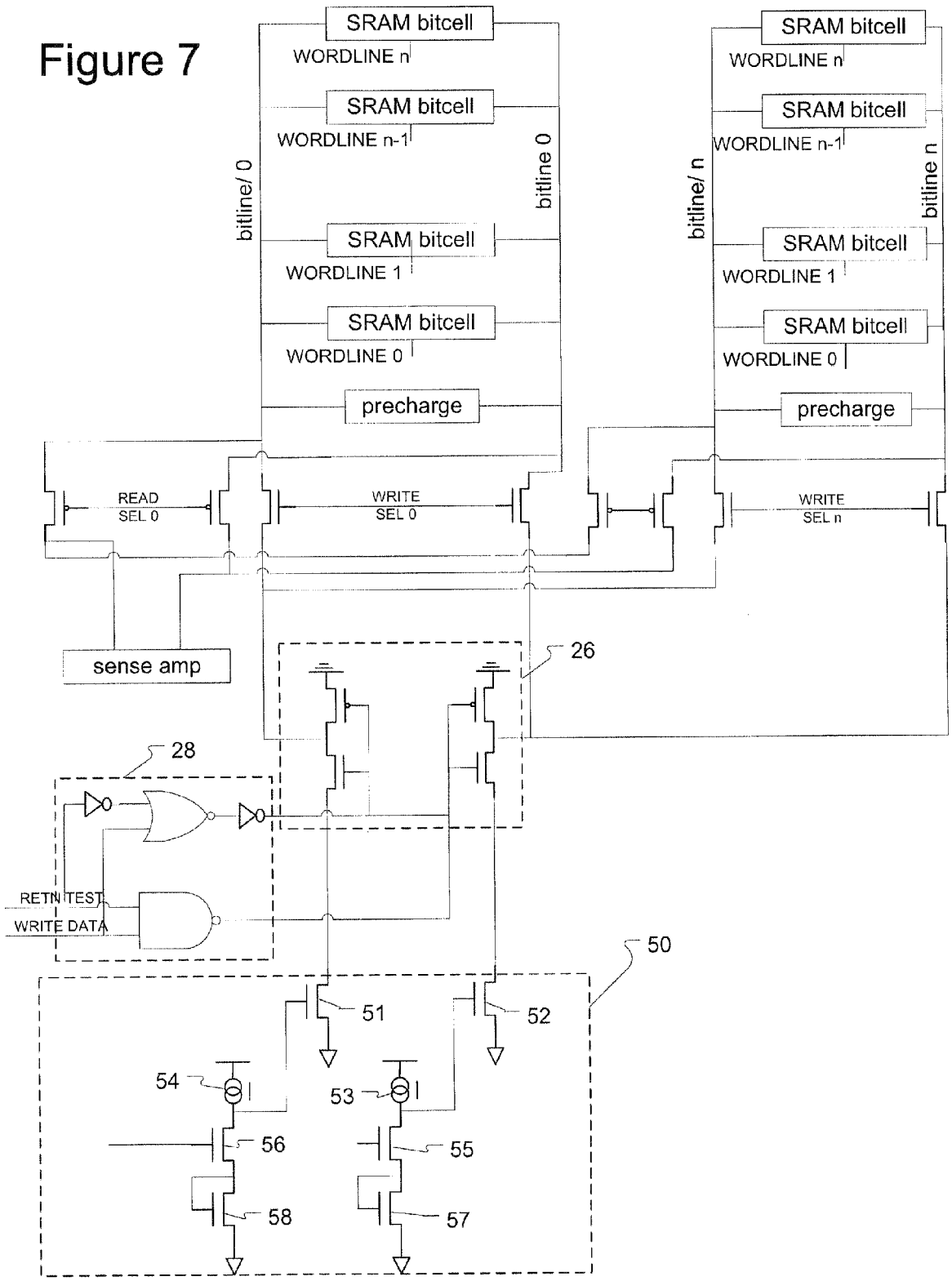
FIG. 7 shows another alternative example of an SRAM array with data retention test circuitry.

In FIG. 7, write driver circuit 26 and logic block 28 remain unaltered from FIG. 2. Retention test circuit 50 is implemented such that during normal operation, n-channel transistors 51 and 52 provide a low impedance path to the ground supply and thus have no impact on the normal functioning of the write driver circuit 26. While in the retention test mode only one of the transistors 51 or 52 will provide a low impedance path to the ground supply. The other transistor of the pair will provide a moderately higher impedance to the ground supply determined by the current mirror established by either current source 54 in combination with n-channel transistors 51, 56, and 58, or current source 43 in combination with n-channel transistors 52, 55, and 57.

In the case of a retention test write 1, the current mirror established by current source 54 in concert with n-channel transistors 51, 56, and 58 will establish a voltage that is slightly offset above ground on the selected bitline. Transistor 52 will be biased such that it is low impedance to the ground supply and will establish a voltage that is at ground level on the selected bitline/.

The special test mode alters the logic high voltage during a write cycle, while all of the timings remain the same as in a usual write operation. In some cases a longer write cycle may be required to allow achievement of a sufficient offset voltage. When in the special test mode, the high side of the memory cell latch that would normally be driven to a full logic 1 level receives instead a signal having a voltage that is offset by a few hundred millivolts above the complement 0 state. The offset level voltage can be achieved by a variety of means as previously discussed. The offset voltage needs to be just high enough that in the cross coupled latch of a memory cell one side of the latch has a slight advantage, or head start, when both sides are allowed to begin charging following the wordline shutting off a the end of the write cycle.

At the end of the retention test write operation, both sides of the cell are required to charge toward a high state, with one side of the cell beginning to charge from ground and one side beginning to charge from ground plus the slight offset voltage. During the charging process that occurs at the end of each retention test write operation, each p-channel transistor is expected to provide charging current to each respective side of the memory cell latch that would act to drive it to a full logic 1 level. For a memory cell that is fully intact, where both p-channel transistors are present, the side of the cell that has received the slightly positive offset voltage can be expected to win a race to charge to a 1 level against the side of the cell that has received a ground voltage level. In this case, the side of the cell that is given the head start achieves a high level first, and the cell will set in the correct state.

If a p-channel transistor that should be present on either side of a memory cell is missing or very weak, it will not be able to provide sufficient charging current. The opposite side of the cell that began at ground will charge faster to a high state even though it began with a lesser voltage and will achieve the high level first, setting the cell in an incorrect state.

Figure 8:
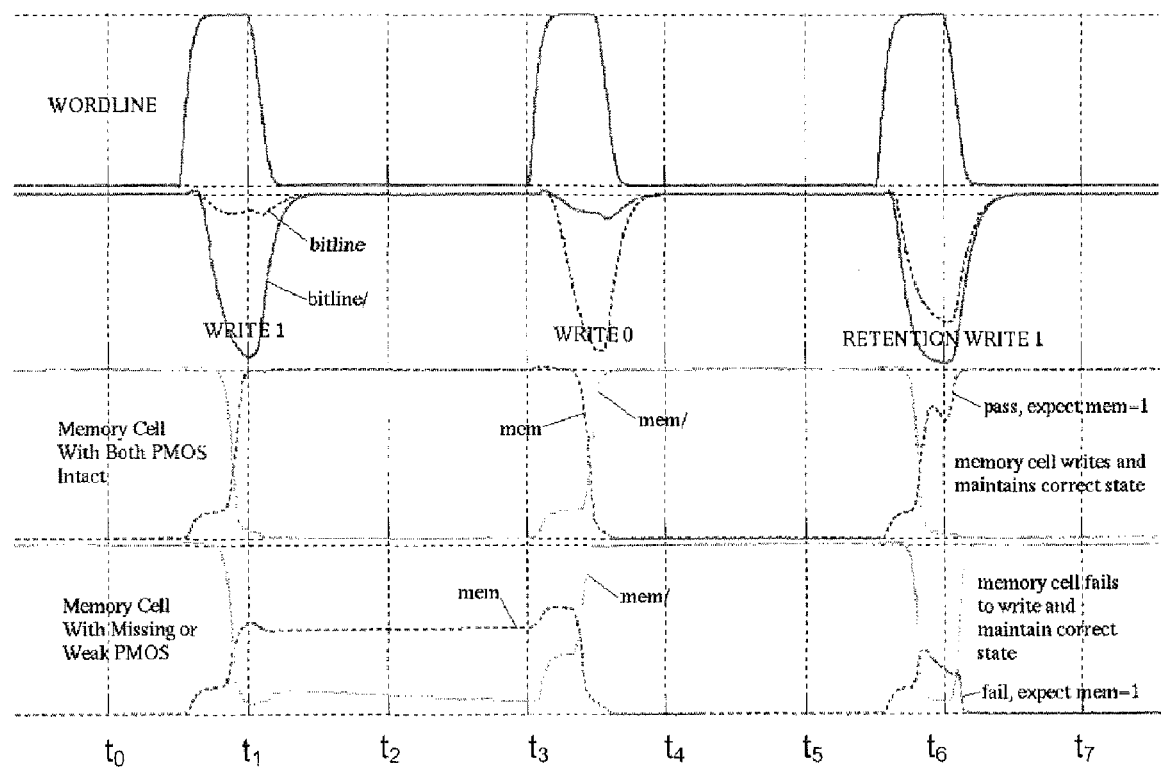
FIG. 8 shows a timing diagram for a data retention test.

FIG. 8 shows results of testing performed using the special test mode. In these figures, the top trace shows the wordline and the second trace shows the bitline and the bitline/. The third trace shows a fully intact memory cell with traces for 'mem' and 'mem/', and the fourth trace shows a memory cell with a faulty p-channel transistor with traces for mem and mem/.

The process starts at t0. At t1, a normal write=1 operation occurs during the first wordline pulse, and the bitline and bitline/ drive to complemented data. The bitline and bitline/ drive to complemented data, in this example, a logic 0 state for the bitline/ and a logic 1 state for the bitline. In the functional memory cell shown in the third set of traces, the mem signal achieves a full logic 1 level due to the presence of a p-channel transistor in the cell and the mem/ signal achieves a full logic 0 level. For the faulty memory cell shown in the fourth set of traces, the mem signal achieves a degraded high voltage level that is passed through select transistor N4 due to a missing p-channel transistor P2 of FIG. 1 while mem/ signal achieves a full logic 0 level.

The system remains in the state achieved after the first wordline pulse from t1 to t3 with a degraded high state on mem and full logic 0 on mem/. This latch state can remain for many milliseconds or even seconds, but eventually the mem state will degrade further to the point where the cell will flip and switch to the opposite state. A normal write=0 operation occurs between t3 and t4 during the second wordline pulse. In both the fully functioning memory cell and the faulty memory cell, the mem signal achieves a logic 0 and the mem/ signal achieves a full logic 1 because both cells have fully intact p-channel transistors on this side of the memory cell latch. Both cells will maintain the data state.

The third wordline pulse at t6 is for the data retention test, specifically a retention write=1. During a normal write cycle, the memory cell formed by the inverters shown in FIG. 1 is forced externally by the bitlines to one of the two bistable states. Using the adapted array of FIG. 3, the bitline and consequently the mem side of the cell is driven to a slightly offset voltage above the complemented 0 state rather than a stronger high level while the bitline/ and consequently the mem/ side of the cell is driven to a full ground or 0 state. This establishes a race condition inside of the latch, with the mem side receiving a slight 'head start' versus the mem/ side. If the p-channel functions correctly, it will charge the mem side fast enough to pull the slightly offset positive voltage up to a full high level and correctly set the latch. This is shown by the third set of traces at t6.

If, on the other hand, the p-channel on the mem side of the cell does not exist or does not function correctly, the mem/ side of the cell that had the logic 0 will charge faster and the latch will be set to the opposite of the intended state. In the second set of traces, the bitline has a level only slightly higher than the bitline/. The third set of traces of the fully functioning memory cell show that the mem signal attains a full logic 1 level, the expected value. The fourth set of traces show that the mem signal 50 fails to write the 1 and fails the test, returning a full logic 0 signal for an expected value of full logic 1 level. A subsequent read would show this incorrect state.

It should be noted that in most cases the timing and functions remains as in a normal write cycle. The test merely requires two passes through an otherwise normal memory test, one pass for each p-channel transistor in the cell. The results become available in a predictable, relatively short, period of time. Further, the test returns a stable, known result, rather than returning what is an expected value that may not remain as expected for very much longer.

Thus, although there has been described to this point a particular embodiment for a method and apparatus for testing SRAM data retention, it is not intended that such specific references be considered as limitations upon the scope of this invention except in-so-far as set forth in the following claims.

What is claimed is:

1. A method of testing a memory cell, comprising:
   providing write data;
   generating a first signal having a level corresponding to a logic low;
   generating a second signal to be a complement of the first signal such that the second signal is reduced to a reduced logic high level just above the level corresponding to a logic low;
   providing the first and second signals to a memory cell; and
   testing the memory cell to determine if the memory cell retains a state corresponding to the first and second signals.

2. The method of claim 1, wherein providing write data comprises providing write data to a data retention test circuit.

3. The method of claim 1, wherein generating a second signal further comprises:
   generating a logic high signal; and
   reducing the logic high signal to the reduced logic high signal operating on the signal with at least one offset voltage controller.

4. The method of claim 3, wherein the offset voltage controller comprises at least one n-channel transistor, current source or resistive element.

5. The method of claim 1, wherein providing the first and second signals to a memory cell further comprises providing the first and second signals to a memory cell having a functioning p-cell transistor, such that the second signal returns to the logic high level.

6. The method of claim 1, wherein providing the first and second signals to a memory cell further comprises providing the first and second signals to a memory cell having a one of either a faulty or non-existent p-cell transistor, such that the second signal does not return to the logic high level.

7. A memory array, comprising:
   an array of memory blocks;
   a write select circuit to provide write data to the array of memory blocks, the write data including a signal corresponding to a logic high and a signal corresponding to a logic low; and
   a data retention test circuit to reduce the write data signal corresponding to a logic high to a level corresponding to a logic low plus an offset.

8. The memory array of claim 7, the data retention test circuit further comprising at least one offset voltage controller.

9. The memory array of claim 8, wherein the offset voltage controller comprises at least one of an n-channel transistor, a current source or a resistive element.

10. The memory array of claim 7, wherein the memory blocks comprise SRAM memory cell blocks.

11. The memory array of claim 7, wherein the memory blocks comprise data latches.

12. A method of testing a memory cell, comprising:
   generating a logic low signal;
   generating a logic high signal;
   reducing the logic high signal to a level corresponding to the logic low signal plus an offset to produce a reduced logic high signal;
   providing the logic low signal and the reduced logic high signal to a memory cell;
   allowing the memory cell to achieve a memory state; and
   testing the memory cell to determine if the memory state is an expected memory state.

13. The method of claim 12, wherein reducing the logic high signal comprises reducing the logic high signal to the level corresponding to the logic low signal plus a transistor threshold voltage.

14. The method of claim 13, wherein reducing the logic high signal comprises operating on the logic high signal with at least one offset voltage controller.

15. The method of claim 14, wherein the offset voltage controller comprises at least one of an n-channel transistor, a current source or a resistive element.

16. The method of claim 12, wherein testing the memory cell comprises testing the memory cell and determining that the memory state is not in the expected state.

17. The method of claim 12, wherein testing the memory cell comprises testing the memory cell and determining that the memory state is in the expected state.

* * * * *